United States Patent
Dong et al.

(10) Patent No.: US 7,390,437 B2
(45) Date of Patent: Jun. 24, 2008

(54) ALUMINATE-BASED BLUE PHOSPHORS

(75) Inventors: Yi Dong, Tracy, CA (US); Ning Wang, Martinez, CA (US); Shifan Cheng, Moraga, CA (US); Yi-Qun Li, Walnut Creek, CA (US)

(73) Assignee: Intematix Corporation, Fremont, CA (US)

( * ) Notice: Subject to any disclaimer, the term of this patent is extended or adjusted under 35 U.S.C. 154(b) by 254 days.

(21) Appl. No.: 11/173,342

(22) Filed: Jul. 1, 2005

(65) Prior Publication Data

US 2006/0027786 A1 Feb. 9, 2006

Related U.S. Application Data

(63) Continuation-in-part of application No. 10/912,741, filed on Aug. 4, 2004.

(51) Int. Cl.
C09K 11/64 (2006.01)
C09K 11/55 (2006.01)

(52) U.S. Cl. .................................. 252/301.4 R
(58) Field of Classification Search ........... 252/301.4 R
See application file for complete search history.

(56) References Cited

U.S. PATENT DOCUMENTS

| | | | |
|---|---|---|---|
| 3,294,699 A | 12/1966 | Lange | |
| 4,110,660 A | 8/1978 | Wolfe | |
| 4,161,457 A | 7/1979 | Takahashi et al. | |
| 4,249,108 A | 2/1981 | Wolfe | |
| 5,471,113 A | * 11/1995 | De Backer et al. | 313/487 |
| 5,611,959 A | * 3/1997 | Kijima et al. | 252/301.4 R |
| 5,714,835 A | * 2/1998 | Zachau et al. | 313/486 |
| 5,879,586 A | * 3/1999 | Kitamura et al. | 252/301.4 R |
| 6,187,225 B1 | 2/2001 | Rao | |
| 6,555,958 B1 | 4/2003 | Srivastava et al. | |

(Continued)

OTHER PUBLICATIONS

Shimomura et al, "Effect of Ammonium Chloride Addition on Spray Pyrolysis Synthesis of baMgAl10o17:Eu2+ Phosphor Without Post-Heating", Jour. Elctrochem Soc. 151(8), H192-7, Jun. 25, 2004.*

(Continued)

*Primary Examiner*—C. Melissa Koslow
(74) *Attorney, Agent, or Firm*—Buchanan, Ingersoll & Rooney LLP

(57) ABSTRACT

Embodiments of the present invention are directed in general to novel aluminate-blue phosphors. Specifically, embodiments of the present invention are directed to use of the novel aluminate-based blue phosphors in white light illumination systems, and in display applications such as back lighting in liquid crystal displays (LCD's) and plasma display panels (PDPs). Embodiments of the present invention are further directed toward aluminate-based phosphors having the general formula $(M_{1-x}Eu_x)_{2-z}Mg_zAl_yO_{[2+(3/2)y]}$, where M is a divalent alkaline earth metal other than magnesium (Mg) from group IIA of the periodic table, where $0.05<x<0.5$; $3 \leq y \leq 12$; and $0.8 \leq z \leq 1.2$. In another embodiment, $0.2<x<0.5$. The composition may contain a halogen, such as fluorine or chlorine. M may be either Ba (barium) or Sr (strontium); when M is Ba, the phosphor is a member of the present barium aluminate magnesium (BAM) series; when M is strontium, the phosphor is a member of the present strontium magnesium aluminate (SAM) series.

9 Claims, 13 Drawing Sheets

U.S. PATENT DOCUMENTS

| | | |
|---|---|---|
| 6,576,157 B2 | 6/2003 | Ono et al. |
| 6,686,691 B1 | 2/2004 | Mueller et al. |
| 6,805,814 B2 | 10/2004 | Ezuhara et al. |
| 7,311,858 B2 | 12/2007 | Wang et al. |
| 2004/0061810 A1 | 4/2004 | Lowery et al. |
| 2006/0158090 A1 | 7/2006 | Wang et al. |

OTHER PUBLICATIONS

G. Blasse et al., "Fluorescence of $Eu^{2+}$-activated alkaline-earth aluminates," *Philips Research Reports* vol. 23, pp. 201-206, 1968.

* cited by examiner

ALUMINATE-BASED BLUE PHOSPHORS

REFERENCE TO RELATED APPLICATION

The present application is a continuation-in-part of U.S. patent application Ser. No. 10/912,741, filed Aug. 4, 2004, and titled "Novel phosphor systems for a white light emitting diode (LED)," by inventors Yi Dong, Ning Wang, Shifan Cheng, and Yi-Qun Li. U.S. patent application Ser. No. 10/912,741 is hereby incorporated by reference in its entirety.

BACKGROUND OF THE INVENTION

1. Field of the Invention

Embodiments of the present invention are directed in general to novel aluminate-blue phosphors (herein referred to as blue phosphors). Specifically, embodiments of the present invention are directed to use of the novel aluminate-based blue phosphors in white light illumination systems, display applications as in back lighting in liquid crystal displays (LCD's), plasma display panels (PDP's), and cathode ray tube (CRT) displays, signal lights, and pointers.

2. State of the Art

It has been suggested that white light illumination sources based wholly or in part on the light emitting diode will likely replace the conventional, incandescent light bulb. Such devices are often referred to as "white LEDs," although this may be somewhat of a misnomer, as an LED is generally the component of the system that provides the energy to another component, a phosphor, which emits light of more-or-less one color; the light from several of these phosphors, possibly in addition to the light from the initial pumping LED are mixed to make the white light.

Nonetheless, white LED's are known in the art, and they are relatively recent innovations. It was not until LED's emitting in the blue/ultraviolet region of the electromagnetic spectrum were developed that it became possible to fabricate a white light illumination sources based on an LED. Economically, white LED's have the potential to replace incandescent light sources (light bulbs), particularly as production costs fall and the technology develops further. In particular, the potential of a white light LED is believed to be superior to that of an incandescent bulb in lifetime, robustness, and efficiency. For example, white light illumination sources based on LED's are expected to meet industry standards for operation lifetimes of 100,000 hours, and efficiencies of 80 to 90 percent. High brightness LED's have already made a substantial impact on such areas of society as traffic light signals, replacing incandescent bulbs, and so it is not surprising that they will soon provide generalized lighting requirements in homes and businesses, as well as other everyday applications.

In general, there have been three general approaches to making white LEDs. One is to combine the output from two or more LED semiconductor junctions, such as that emitted from a blue LED and a yellow LED, or more commonly from red, green, and blue (RGB) LEDs. No phosphors are used in this first approach. The second approach is called phosphor conversion, wherein light from a blue emitting LED semiconductor junction is combined with light obtained from a phosphor excited by the blue LED. In this second situation, some of the photons are down-converted by the phosphor to produce a broad emission centered on a yellow frequency; the yellow color then mixes with other blue photons from the blue emitting LED to create the white light. In a third approach, an LED that emits light in the substantially non-visible ultraviolet (UV) portion of the electromagnetic spectrum is used to excite a blue phosphor and at least one other phosphor, which typically is or includes a yellow phosphor.

Phosphors are widely known, and may be found in such diverse applications as CRT displays, UV lamps, and flat panel displays. Phosphors function by absorbing energy of some form (which may be in the form of a beam of electrons or photons, or electrical current), and then emitting the energy as light in a longer wavelength region in a process known as luminescence. To achieve the required amount of luminescence (brightness) emitted from a white LED, a high intensity semiconductor junction is needed to sufficiently excite the phosphor such that it emits the desired color that will be mixed with other emitted colors to form a light beam that is preceived as white light by the human eye.

In many areas of technology, phosphors are zinc sulfides or yttrium oxides doped with transition metals such as Ag, Mn, Zn, or rare earth metals such as Ce, Eu, or Tb. The transition metals and/or rare earth element dopants in the crystal function as point defects, providing intermediate energy states in the material's bandgap for electrons to occupy as they transit to and from states in the valence band or conduction band. The mechanism for this type of luminescence is related to a temperature dependent fluctuation of the atoms in the crystal lattice, where oscillations of the lattice (phonons) cause displaced electron to escape from the potential traps created by the imperfections. As they relax to initial state energy states they may emit light in the process.

The blue phosphors that have been used in the past in conjunction with near-UV radiation sources have typically been divalent europium (Eu2+) activated barium magnesium aluminate (BAM) phosphors. These blue phosphors have been used in white light systems, as well as in other applications, such as plasma display panels (PDPs) as a blue emitting component.

An example of a BAM phosphor is disclosed in U.S. Pat. No. 4,110,660, where a blend containing $BaF_2$, LiF, $Al(OH)_3$, and $Eu_2O_3$ was fired in a hydrogen atmosphere in the temperature range of 1400 to 1650° F. for a period of 3 to 6 hours. Another blue phosphor has been described in U.S. Pat. No. 4,161,457 to K. Takahashi. This particular phosphor is represented by the formula $aMgO.bBaO.cAl_2O_3.dEuO$, wherein a, b, c, and d are numbers which satisfy the condition $a+b+c+d=10$, and wherein $0 < a \leq 2.00$; $0.25 \leq b \leq 2.00$; $6.0 \leq c \leq 8.5$; $0.05 \leq d \leq 0.30$.

Other blue phosphors which have been described in the art are exemplified by the lanthanum phosphate phosphors that use trivalent Tm as an activator, $Li^+$ and an optional amount of an alkaline earth element as a coactivator, as disclosed by R. P. Rao in U.S. Pat. No. 6,187,225. Such exemplary blue phosphors may be represented by the formula $(La_{1-x-z}Tm_xLi_yAE_z)PO_4$, where $0.001 \leq x \leq 0.05$; $0.01 \leq y \leq 0.05$; and $0 \leq z \leq 0.05$. more specifically, blue phosphors employing Tm3+ and Li+ doped lanthanum phosphate phosphors, particularly when produced by the sol-gel/xerogel and solid state methods are considered to be a part of the present invention.

Blue phosphors generally represented by the formula $(Ba_xM_{1-x})_{1-0.25y}Mg_{1-y}Al_{10+y}O_{17+0.25y}$ as a host material, with Eu as an activator, and wherein M represents Ca, Sr, or Ca and Sr has been described by K. Ono et al. in U.S. Pat. No. 6,576,157, where the stoichiometric amounts of the constituent elements were represented by the relations $0.5 \leq x \leq 1$, and $0.05 \leq y \leq 0.15$, and where the phosphor was excited by vacuum ultraviolet radiation.

Multiphase structured $Eu^{2+}$ activated La, Mg aluminate phosphors have been prepared. U.S. Pat. No. 4,249,108 reveals that the starting materials $La_2O_3$, MgO, $Al(OH)_3$, and $Eu_2O_3$ may be fired at about 1500 to 1650° C., for about 1 to 5 hours in a reducing atmosphere. Additional blue phosphors that may be used with the present green phosphors include those disclosed in U.S. Pat. No. 5,611,959, where aluminate phosphors were taught comprising at least one element selected from the group consisting of Ba, Sr, and Ca; a Eu activator; Mg and/or Zn; and optionally Mn. This phosphor may be prepared by firing the respective oxides and/or hydroxides in a reducing atmosphere at a temperature of 1200 to 1700° C. over a period of 2 to 40 hours.

What is needed in the art is an improved blue phosphor that is capable of emitting light with a higher intensity than the currently available BAM materials. It would also be desirable to have improved blue phosphors wherein minor modifications may be made in the composition to effect changes in the emitted wavelength.

SUMMARY OF THE INVENTION

Embodiments of the present invention include an aluminate-based blue phosphor having the formula $(M_{1-x}Eu_x)_{2-z}Mg_zAl_yO_{[2+(3/2)y]}$; wherein M is at least one of metal selected from the group consisting of Ba and Sr. When M is Ba, the novel phosphors of the present invention may be referred to a BAM phosphor. Likewise, when M is Sr, the phosphor may be referred to as a SAM phosphor.

The relative amounts of M contained in the phosphor, and the Eu activator, may be expressed by the parameter "x," which describes the content of M and Eu in the stoichiometric formula on an atomic number basis. In one of the present embodiments, $0.05<x<1$. In another of the present embodiments, $0.2<x<1$. In further embodiment, the range of x may be $0.05<x<0.5$, and/or $0.2<x<0.5$. This Eu concentration range is novel because the prior art teaches away from such high levels of Eu, primarily because of the luminescent quenching phenomena. Likewise, the amount of aluminum contained in the present phosphors may be described by the "y" parameter, and compositions varied continuously in a range of $3 \leq y \leq 12$ have been found to be novel and advantageous. In some embodiments, "y" can be continuously varied in a range of either $3 \leq y \leq 8$ or $3 \leq y \leq 8$. The blue phosphors of the present embodiments have been found to exhibit a host aluminate crystal structure that is substantially hexagonal in nature. In some embodiments, the value of Z may range from about 0.8 to about 1.2, such that the stoichiometric amount of the Mg in the formulation is about one mole per mole of the combined amount of M (either Ba or Sr) and Eu.

The present phosphors have been configured to absorb radiation in a wavelength ranging from about 280 nm to 420 nm, and to emit visible light having a wavelength ranging from about 420 nm to 560 nm. In particularly, the inventive blue phosphor has an enhanced absorption and emission efficiency in wavelengths in the near UV range (360-410 nm) and the visible blue (420-480 nm), which is useful for LED applications.

Additionally, embodiments of the present invention include an aluminate-based blue phosphor having the formula $(M_{1-x}Eu_x)_{2-z}Mg_zAl_yO_{[2+(3/2)y]} \cdot D$, wherein M is at least divalent metal selected from the group consisting of Ba and Sr. The "x," "y," and "z" parameters have the same values as above. The dopant "D" may be either fluorine, chlorine, bromine, or iodine.

The aluminate-based blue phosphors of the present embodiments are configured to be excited by a non-visible or UV LED emitting radiation having a wavelength ranging from about 280 to 420 nm. The blue phosphor is configured to absorb at least a portion of the radiation from the radiation source and emit blue light with a peak intensity in a wavelength ranging from about 440 to 560 in one embodiment; from about 480 to 520 nm in another embodiment; and from about 480 to 520 nm in yet another embodiment. Embodiments of the present invention include white light systems that utilize the inventive blue phosphors in conjunction with a non-visible UV radiation source, and at least one other phosphor that may be either a yellow, green, or red phosphor.

DETAILED DESCRIPTION OF THE INVENTION

Figure 1:
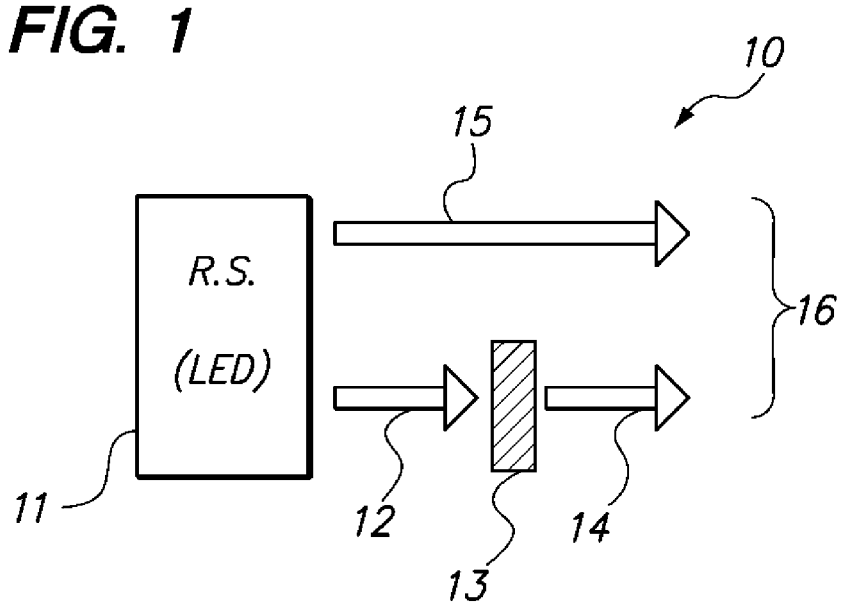
FIG. 1 is a schematic representation of a prior art illumination system comprising a radiation source that emits in the visible and a phosphor that emits in response to the excitation from the radiation source, wherein the light produced from the system is a mixture of the light from the phosphor and the light from the radiation source.

Embodiments of the present invention are directed toward aluminate-based phosphors having the general formula $(M_{1-x}Eu_x)_{2-z}Mg_zAl_yO_{[2+(3/2)y]}$, where M is a divalent alkaline earth metal other than magnesium (Mg) from group IIA of the periodic table. In one embodiment, M may be either Ba (barium) or Sr (strontium). When M is Ba, the phosphor is a member of the present barium aluminate magnesium (BAM) series; when M is strontium, the phosphor is a member of the present strontium magnesium aluminate (SAM) series. Embodiments of the present invention may also include mixtures of BAM and SAM components.

One of the BAM phosphors in conventional use may be represented by the formula $BaMgAl_{10}O_{17}:Eu^{2+}$, a compound whose past applications have included fluorescence lamps, CRT displays, plasma display panel (PDPs) and possibly for light emitting diode (LED) applications. The symbol "$Eu^{2+}$" in such prior art representations is meant to convey that the Eu activator is utilized as a dopant, in amounts as small as 2 atomic percent (see the article by G. Blasse et al., "Fluorescence of $Eu^{2+}$-activated alkaline-earth aluminates," *Philips Research Reports* Vol. 23, pages 201-206, 1968). The prior art teaches that the Eu content must be kept to low amounts in order to avoid the so-called "quenching effect."

What distinguishes the present BAMs from the known art is that the present inventors have surprisingly discovered that the Eu content may be vastly increased over amounts previously used with none of the detrimental effects taught by the quenching rule, that is, that an increase in the Eu content will result in a decrease in the emission intensity of the phosphor. In fact, the present inventors have discovered that just the opposite is true for BAM and SAM phosphors: increasing the Eu content beyond previously accepted levels allows the phosphor's emission and reflection characteristics to be controlled advantageously.

Additional embodiments of the present invention include the above-mentioned aluminate-based blue phosphors further including a halogen dopant; these phosphors may be represented by the formula $(M_{1-x}Eu_x)_{2-z}Mg_zAl_yO_{[2+(3/2)y]}:D$; where the dopant D is a halogen from group VIIB of the periodic table. In some embodiments of the present invention, D may be F (fluorine), Cl (chlorine), Br (bromine), or I (iodine). Embodiments of the present invention may also include mixtures of BAM and SAM components with a halogen dopant.

Furthermore, it has been found by the present inventors that the aluminum content of the phosphor compositions may be continuously varied while preserving the host aluminate crystal structure. While not wishing to be bound by any particular theory, it is believed that this crystal structure is hexagonal. In any event, by varying the aluminum content in a manner whereby the host aluminate crystal structure is substantially unchanged macroscopically. It is believed that the asymmetric local crystal structure is changed to enhance luminescence properties, and the emission and reflection properties of the phosphors may be still further advantageously controlled.

Thus, the inventive new series of BAM and SAM phosphors, with their ability to fine-tune color output, may be used in a variety of applications for which the prior art BAM compositions were not suitable.

Embodiments of the present invention will be described in the following order: examples of the utility of the present aluminate-based blue phosphors will be discussed first, with an emphasis on white LED illumination systems. The discussion about utility will be followed by a general description of the present BAM/SAM phosphors, including the following novel features: 1) a wide variation of aluminum content may be tolerated without substantially affecting host crystal structure; 2) the Eu activator content (relative to the divalent alkaline earth metal content) may be increased above previously taught levels, and 3) halogen dopants are also novel according to the present embodiments. It is by varying aluminum and europium contents, and optionally including a halogen, that the properties of the light emitted from the phosphor may advantageously controlled.

The disclosure will conclude with a comparison of the emission spectra from a white LED utilizing the present aluminate-based blue phosphors to the emission spectra of a white LED having a conventional BAM for the blue phosphor, as this is viewed to be one of the most important market applications of the present BAM and SAM phosphors.

Market Applications of Blue Phosphors, Including White LED Illumination Systems

Embodiments of the present invention are directed in general to novel aluminate-blue phosphors (herein referred to as blue phosphors). The novel aluminate-based blue phosphors of the present embodiments are particularly useful in various display applications, including white light display applications, back lighting in liquid crystal displays (LCD's), plasma display panels (PDP's), and cathode ray tube (CRT) displays, and projection displays such as those used in televisions. Additionally, they are applicable to any isolated blue LED use, such as in decorative lights, signage lights, signal lights, pointers and general illumination. The white light illumination systems of the present embodiments depends on an excitation source that does not contribute substantially to the white light output of the system because the excitation source emits in a region of the electromagnetic spectrum that is not visible to the human eye. These concepts are illustrated schematically in FIGS. 1 and 2.

Referring to the prior art system 10 of FIG. 1, a radiation source 11 (which may be an LED) emits light 12, 15 in the visible portion of the electromagnetic spectrum. Light 12 and 15 is the same light, but is shown as two separate beams for illustrative purposes. A portion of the light emitted from radiation source 11, light 12, excites a phosphor 13, which is a photoluminescent material that is capable of emitting light 14 after absorbing energy from the LED 11. The light 14 is typically yellow. Radiation source 11 also emits blue light in the visible that is not absorbed by the phosphor 13; this is the visible blue light 15 shown in FIG. 1. The visible blue light 15 mixes with the yellow light 14 to provide the desired white illumination 16 shown in the figure. A disadvantage of the prior art illumination system 10 of FIG. 1 is that the color output of the system 10 depends on the output 15 of the radiation source 11.

The color output of the present white light illumination system does not vary significantly with the color output of the radiation source (e.g., LED) if the white light emitted by the system does not emit radiation at a wavelength that is significantly visible to the human eye. For example, and LED may be constructed to emit ultraviolet (UV) radiation having a wavelength of 380 nm or less, which is not visible to the human eye. Furthermore, the human eye is not very sensitive to UV radiation having a wavelength between about 380 and 400 nm, nor is it substantially sensitive to violet light having a wavelength between about 400 and 420 nm. Therefore, the radiation emitted by a source having a wavelength of about 420 nm or less will not substantially affect the color output of the white light illumination system.

Figure 2:
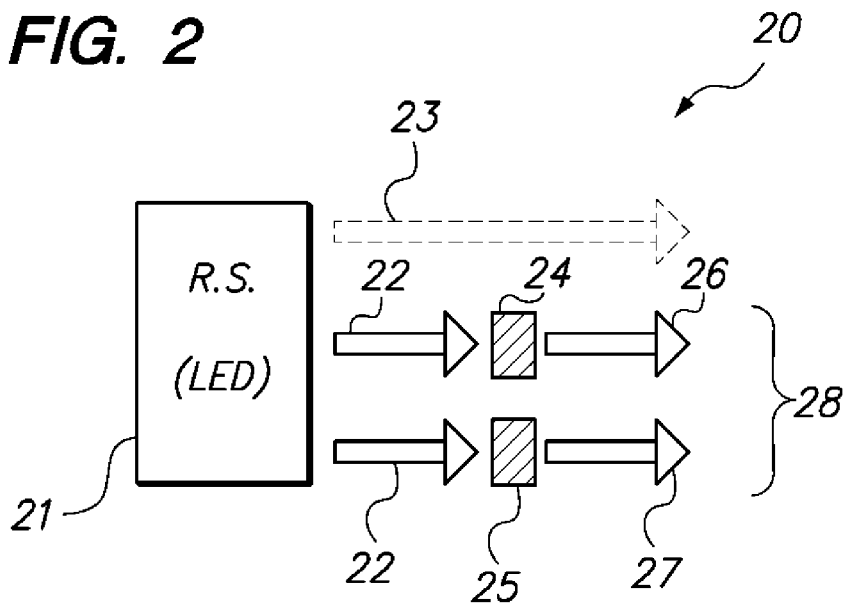
FIG. 2 is a schematic representation of an illumination system comprising a radiation source that emits in the non-visible such that the light coming from the radiation source does not contribute to the light produced by the illumination system.

This aspect of the present invention is illustrated in FIG. 2. Referring to FIG. 2, substantially non-visible light is emitted from radiation source 21 as light 22, 23. Light 22, 23 has the same characteristics, but different reference numerals have been used to illustrate the following point: light 22 may be used to excite a phosphor, such as phosphor 24 or 25, to make light 26, 27, respectively, but that light 23 emitted from the radiation source 21 which does not impinge on a phosphor does not contribute to the color output 28 from the phosphor(s) because light 23 is substantially invisible to the human eye. In one embodiment of the present invention, radiation source 21 is an LED that emits light having a wavelength generally ranging from about 350 to 410 nm. In alternative embodiments, radiation sources having excitation wavelengths up to 420 nm are feasible. It will be understood by those skilled in the art that near UV radiation 400 nm and higher may contribute to the color rendition of the white light emitted from the white light LED if the radiation source is strong enough in its intensity.

A second way to avoid affecting the color output of the white illumination system 20 is to configure the luminescent materials 24, 25 (referring to FIG. 2) such that they each have a thickness that is sufficient to prevent radiation from the LED 21 from passing through the material. For example, if the LED emits visible light between about 420 and 650 nm, then in order to ensure that the phosphor thickness does not affect the color output of the system, the phosphor should be thick enough to prevent any significant amount of the visible radiation emitted by the LED from penetrating through the phosphor.

The Aluminate Structure and Aluminum Content of the Novel Blue Phosphors

The blue phosphors of the present embodiments are based on a variety of compositions with varying aluminum content. One of the novel features of the present phosphors is that the aluminum content may be varied continuously, within certain limits, without substantially changing the host aluminate crystal structure. This may be proven by x-ray diffraction (XRD), as shown in FIG. 3.

Figure 3:
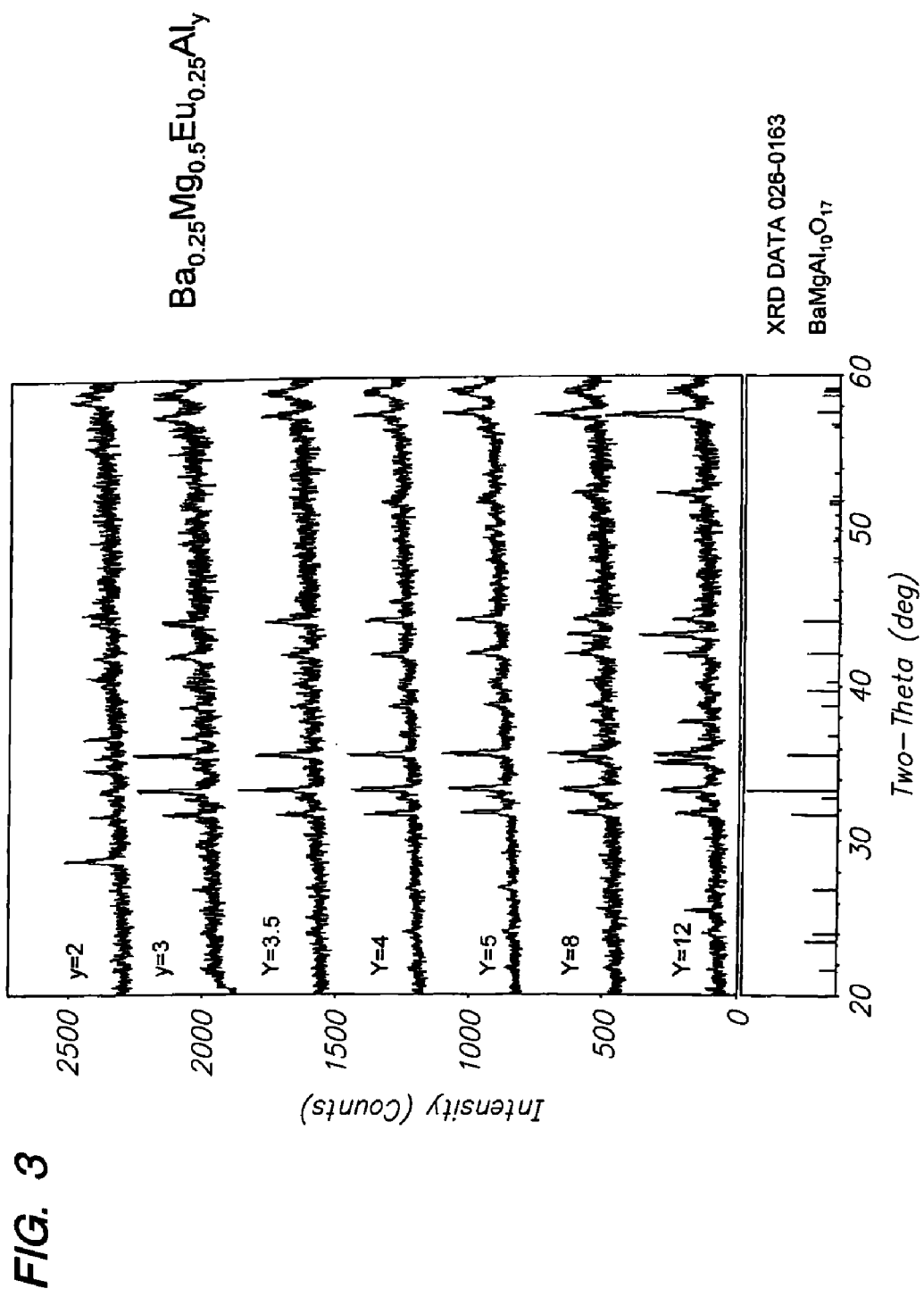
FIG. 3 is x-ray diffraction (XRD) data of a series of the present barium aluminate magnesium (BAM) phosphors having a variable aluminum content and a greater content of the activator Eu than that previously used in the art: the general stoichiometric formula of these phosphors is $Ba_{0.25}Mg_{0.5}Eu_{0.25}Al_yO_{[1+(3/2)y]}$; also shown is XRD data from the conventional BAM that may be represented by the formula $BaMgAl_{10}O_{17}:Eu^{2+}$.

FIG. 3 shows x-ray diffraction data of a series of compositions having the generalized stoichiometric formula $Ba_{0.25}MgO_{0.5}Eu_{0.25}Al_yO_{[1+(3/2)y]}$, where the value of "y" ranges from about 3 to about 12 when the atomic sum of the bivalent elements in the formula (e.g., Ba, Mg, plus Eu) is equal to one. Also shown in FIG. 3, at the bottom of the figure, is XRD data from the conventional BAM that may be represented by the formula $Ba_{0.5}Mg_{0.5}Al_5O_{8.5}:Eu^{2+}$ (again, written in the convention where the atomic sum of the bivalent elements totals one).

The data in FIG. 3 shows that although the aluminum content had been varied for values of "y" ranging from about 3 to about 12, inclusive, the hexagonal crystal structure remained substantially unchanged throughout the series. The specific values of y in the compositions tested by x-ray diffraction were 3, 3.5, 4, 5, 8, and 12, but it will be recognized by those skilled in the art that any combination of the above compositions may be present, and "y" does not have to take on integral values. Additionally, the value of y does not have to be constant throughout any particular phosphor; in fact, it was noted experimentally that a second phase did appear for the formulations having y values equal to 8 and 12.

It is perhaps beneficial to write the stoichiometric formulations of the present phosphors in an alternative format, to emphasize the fact that the atomic ratios of the aluminum to oxygen in the formula may be significantly changed without disrupting the hexagonal nature of the host aluminate crystal structure. In these formulas, M is either Ba or Sr. For example, the aluminate phosphor where y is equal to 3 may also be written as $(M_{1-x}Eu_xMg_{0.5})_2Al_6O_{11}$.

Alternatively, the present aluminate phosphors may be provided according to embodiments of the present invention where y was equal 3.5 according to the previous nomemclature, such that the phosphor has the formula $(M_{1-x}Eu_x Mg_{0.5})_4 Al_{14}O_{25}$.

Alternatively, the present aluminate phosphors may be provided according to embodiments of the present invention where y is equal 4, such that the phosphor has the formula $(M_{1-x}Eu_x Mg_{0.5})Al_4O_7$.

Alternatively, the present aluminate phosphors may be provided according to embodiments of the present invention where y is equal 5, such that the phosphor has the formula $(M_{1-x}Eu_x Mg_{0.5})_2Al_{10}O_{17}$.

Alternatively, the present aluminate phosphors may be provided according to embodiments of the present invention where y is equal 8, such that the phosphor has the formula $(M_{1-x}Eu_x Mg_{0.5})Al_8O_{13}$.

Alternatively, the present aluminate phosphors may be provided according to embodiments of the present invention where y is equal 12, such that the phosphor has the formula $(M_{1-x}Eu_x Mg_{0.5})Al_{12}O_{19}$.

Although the data of FIG. 3 is shown for the case where M was Ba, the same trend was found when the divalent, alkaline earth metal M was strontium (Sr); in other words, varying the aluminum content, and/or aluminum to oxygen ratio, did not change the host crystal structure for SAM phosphors as well. The significance of this flexibility in variation of aluminum content is that it may be used to optimize the phosphor composition(s) to meet the demands of a specific market application.

Figure 4A:
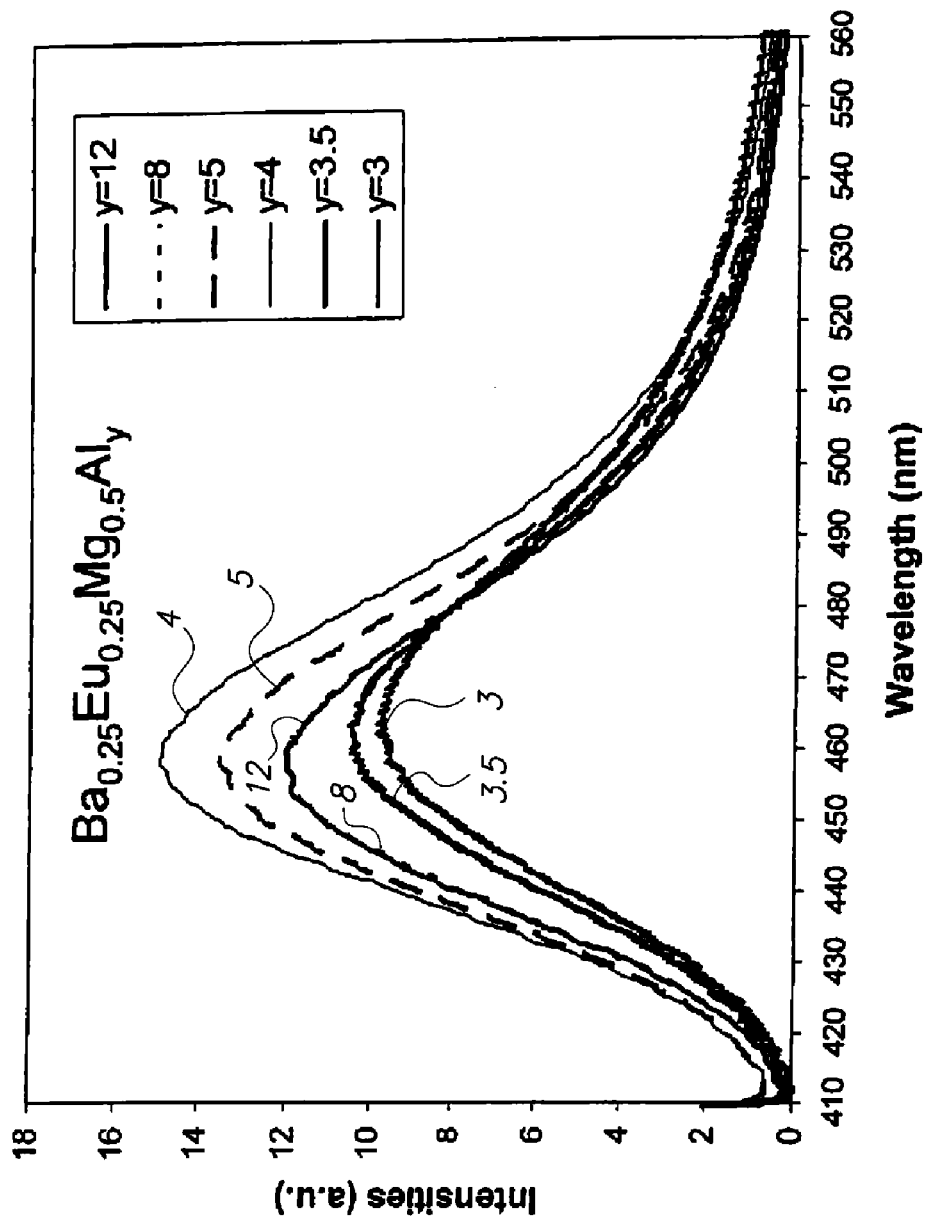
FIGS. 4A and 4B are emission and reflection spectra, respectively, of a series of the present barium aluminum magnesium (BAM) phosphors having a variable aluminum content represented by the formula $Ba_{0.25}Mg_{0.5}Eu_{0.25}Al_yO_{[1+(3/2)y]}$.
Figure 4B:
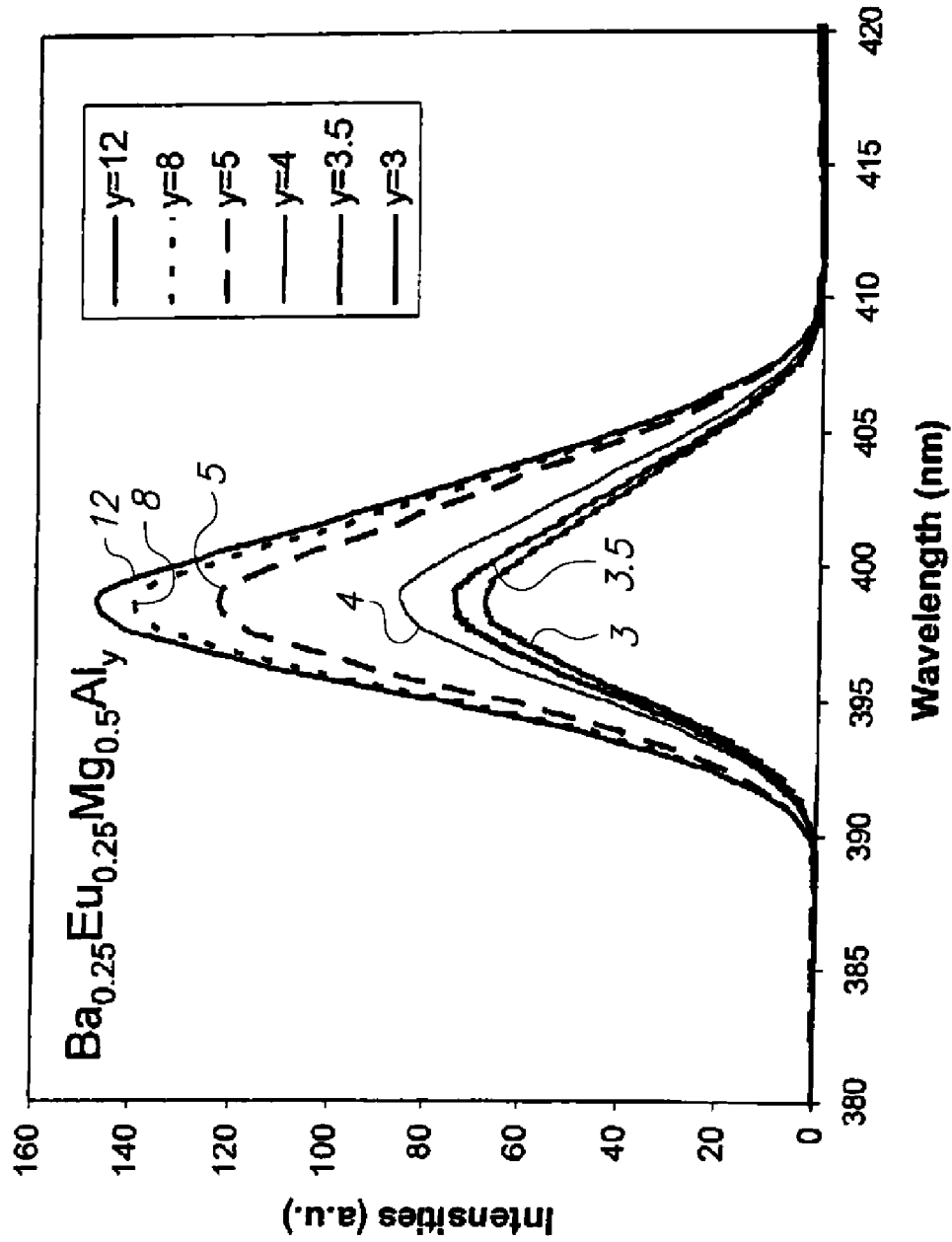

Although changing the aluminum content relative to the amount of bivalent elements in the composition (or, stated another way, the ratio of the aluminum to the oxygen) does not effect the hexagonal nature of the host aluminate crystal structure, as discussed above, it can have profound effects on emission and reflection characteristics. FIGS. 4A and 4B are emission and reflection spectra, respectively, of a series of the present barium aluminum magnesium (BAM) phosphors having a variable aluminum content represented by the formula $Ba_{0.25}Mg_{0.5}Eu_{0.25}Al_yO_{[1+(3/2)y]}$; where y takes on exemplary values over the range y=3 to 12, inclusive. In these exemplary compositions, the total content of the bivalent elements summed to one, and the amount of the barium plus the europium was roughly equal to the amount of magnesium. The excitation wavelength used to produce the emission and reflection spectra of FIGS. 4A and 4B was about 400 nanometers (nm).

The experimental set-up may be described briefly as follows: the 400 nm excitation radiation is directed toward the sample, where a portion is reflected back from the sample towards the detector, and a portion is absorbed by the sample. Of course, the reflected radiation also has a wavelength of about 400 nm, the same as the excitation radiation. But the radiation that is absorbed may excite electrons across the bandgap of the material causing a so-called "down-conversion" process, such that photons of lower energy (and therefore longer wavelength; e.g., from about 450 to about 460 nm), are emitted from the material in a geometric direction that is also towards the detector.

The data in FIG. 4A shows that the wavelength at which peak emission occurs decreases slightly, from about 468 to about 460, as the amount of aluminum (denoted by the "y" parameter) increases from 3 to 4; further increases in the amount of the aluminum content (to y=12) cause the wavelength at which peak emission occurs to increase to a value intermediate between 460 and 468 nm. Similarly, the intensity of the peak increased dramatically from y=3 to y=4, then decreased to an intermediate value in relative intensity as the aluminum content was further increased to 12.

Interestingly, the reflection data in FIG. 4B shows a slightly different trend. Here, it was found that the wavelength at which the reflection peak occurs increased continuously as the aluminum content was went from 3 to 12. Likewise, the reflection intensity also increased continuously throughout the series.

Figure 5:
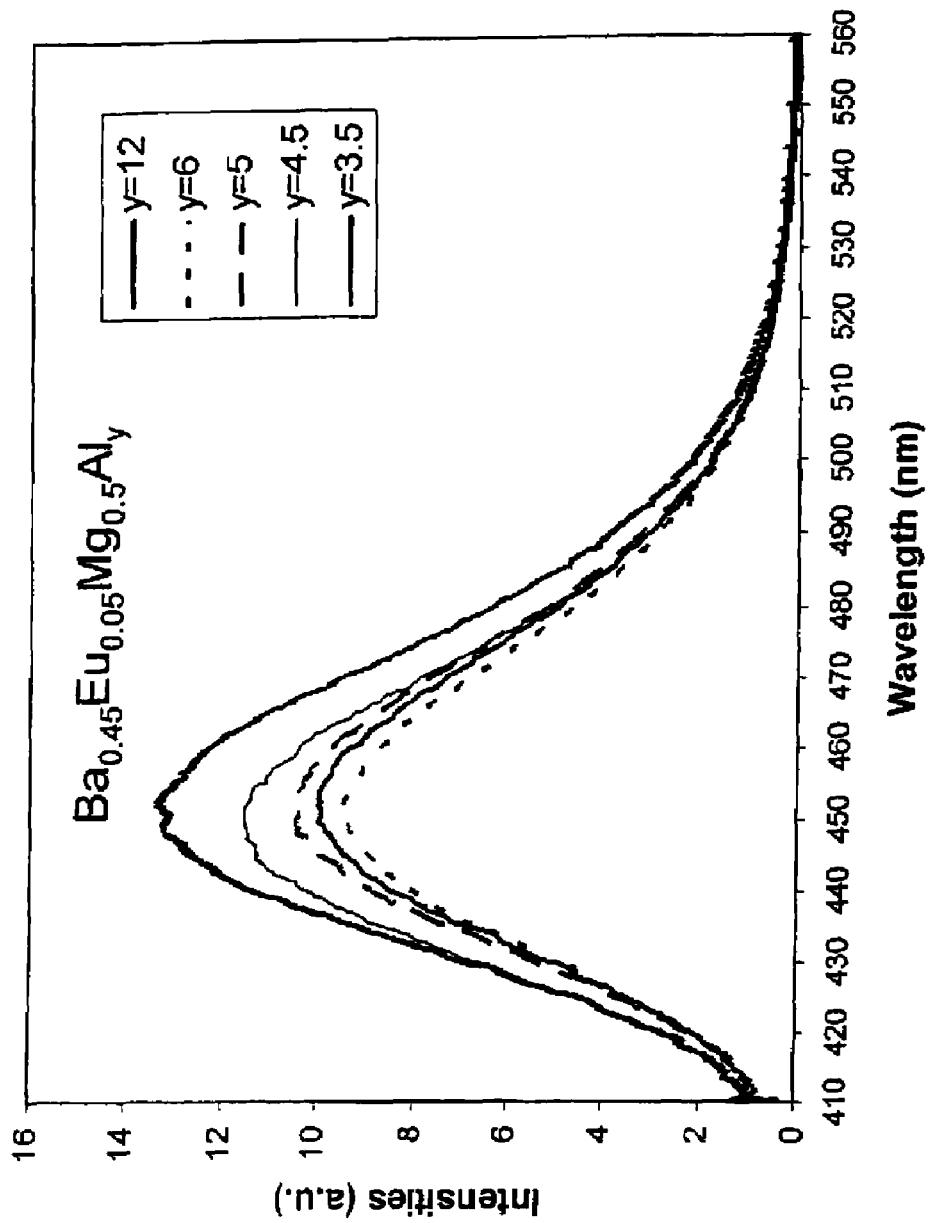
FIG. 5 show emission spectrum of another series of the present barium aluminum magnesium (BAM) phosphors having a variable aluminum content, this time with the barium level set to a higher value than the BAM phosphors of FIGS. 4A-4B; the BAM phosphors of FIG. 5 represented by the formula $Ba_{0.45}Mg_{0.5}Eu_{0.05}Al_yO_{[1+(3/2)y]}$.

The trends discussed in FIGS. 4A and 4B pertained to a fixed amounts of the divalent elements wherein the barium and europium content equaled that of the magnesium, and wherein the total divalent content was one (by atomic number); the question is, what happens at different barium levels? Data to answer this question is provided by FIG. 5, which is a plot of the emission spectra of a series represented by $Ba_{0.45}Eu_{0.05}Mg_{0.5}Al_yO_{[1+(3/2)y]}$. In this case, the composition with y=3.5 demonstrated the highest emission intensity and the shortest peak emission wavelength, and the composition with y=6 the lowest intensity and the longest peak emission wavelength. Compositions with values of y between 3.5 and 12 were intermediate in peak emission wavelength and intensity.

Figure 6:
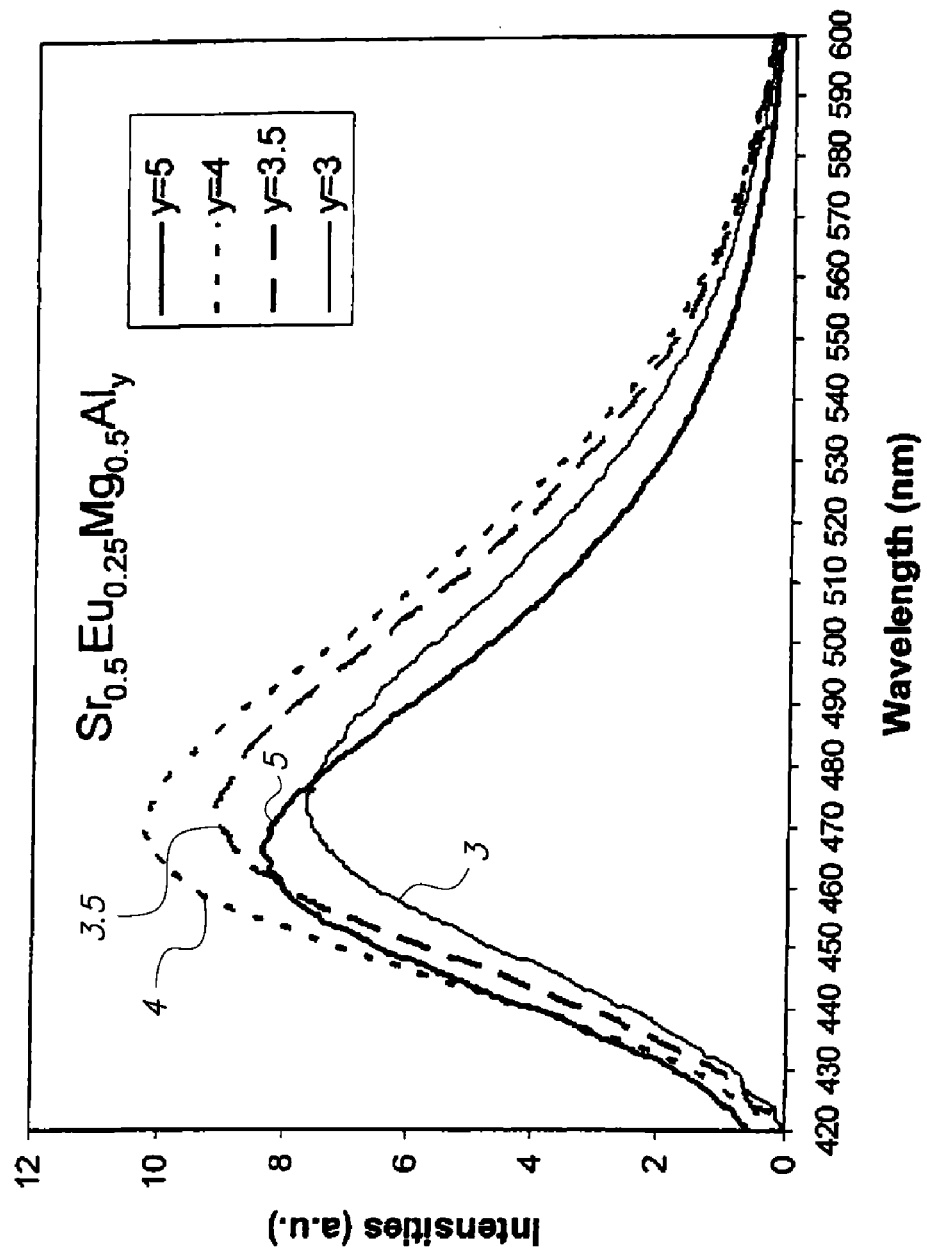
FIG. 6 shows emission spectra from a series of the present strontium aluminum magnesium (SAM) phosphors having a variable aluminum content, the SAM phosphors of this series represented by the formula $Sr_{0.25}Mg_{0.5}Eu_{0.25}Al_yO_{[1+(3/2)y]}$.

Just as the relative amounts of Ba to Eu may be varied in a BAM phosphor, so too may the relative amount of Sr to Eu be varied in a SAM phosphor. FIG. 6 is an emission spectrum for the composition $Sr_{0.25}Eu_{0.25}Mg_{0.5}Al_yO_{[1+(3/2)y]}$, which is a figure analogous to the emission spectrum for a BAM shown in FIG. 4A. As with the Ba case, the peak emission wavelength shifts slightly from higher values (about 473 nm) to lower values (about 465 nm) as the aluminum content is decreased from y=3 to y=5. The maximum emission intensity is found for the composition where y=4, the same finding as that for the BAM series. The results from the SAM series shown in FIG. 6 differ from that of the BAM series of FIG. 4A, however, in that europium quenching began to manifest itself gradually as the aluminum content was increased for composition with y greater than about 5, so the emission intensities for y=8 and y=12 are not shown in FIG. 6.

Though not shown graphically, the SAM reflection series for varying aluminum content showed the same trend as that for the BAM series: the height of the reflection peaks decreased continuously as the aluminum content was decreased.

FIGS. 4A, 4B, 5, and 6 demonstrate how the emission and reflection behavior of the novel BAM and SAM phosphors may be optimized to fit a suitable market need by changing the changing the aluminum content of the phosphor. Advantageously, it has been shown that the hexagonal crystal structure of the aluminate host does not change as a result of this optimization.

The Relative Content of the Group IIA Alkaline Metal to the Activator

The novel phosphors of the present embodiments may be represented by the formula $(M_{1-x}Eu_x)_{2-z}Mg_zAl_yO_{[2+(3/2)y]}$, where the "x" parameter represents the relative amount of the alkaline earth metal M (other than magnesium) and the Eu activator. It was noted above that the present BAM and SAM phosphors may be distinguished from the known art in that the Eu content has be vastly increased over amounts previously used, surprisingly, with none of the detrimental effects taught by the "quenching rule." That increasing Eu content over previously accepted levels allows the phosphor's emission and reflection characteristics to be controlled advantageously will be shown in this section of the disclosure.

Figure 7A:
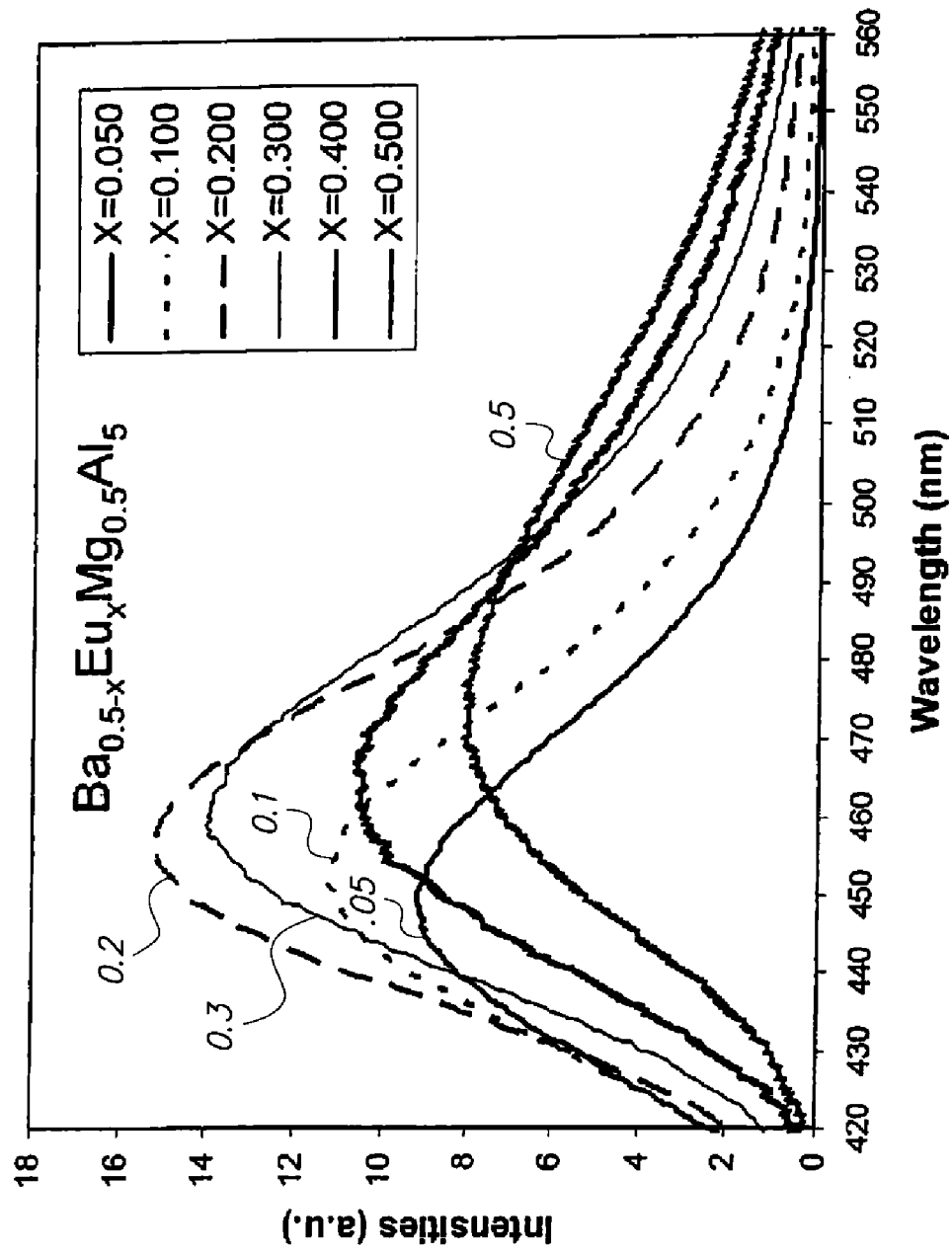
FIGS. 7A and 7B are emission and reflection spectra, respectively, of a series of the present barium aluminum magnesium (BAM) phosphors wherein the relative content of the barium and the Eu activator has been varied: these phosphors may be represented by the formula $Ba_{0.5-x}Eu_xMg_{0.5}Al_5O_{8.5}$.
Figure 7B:
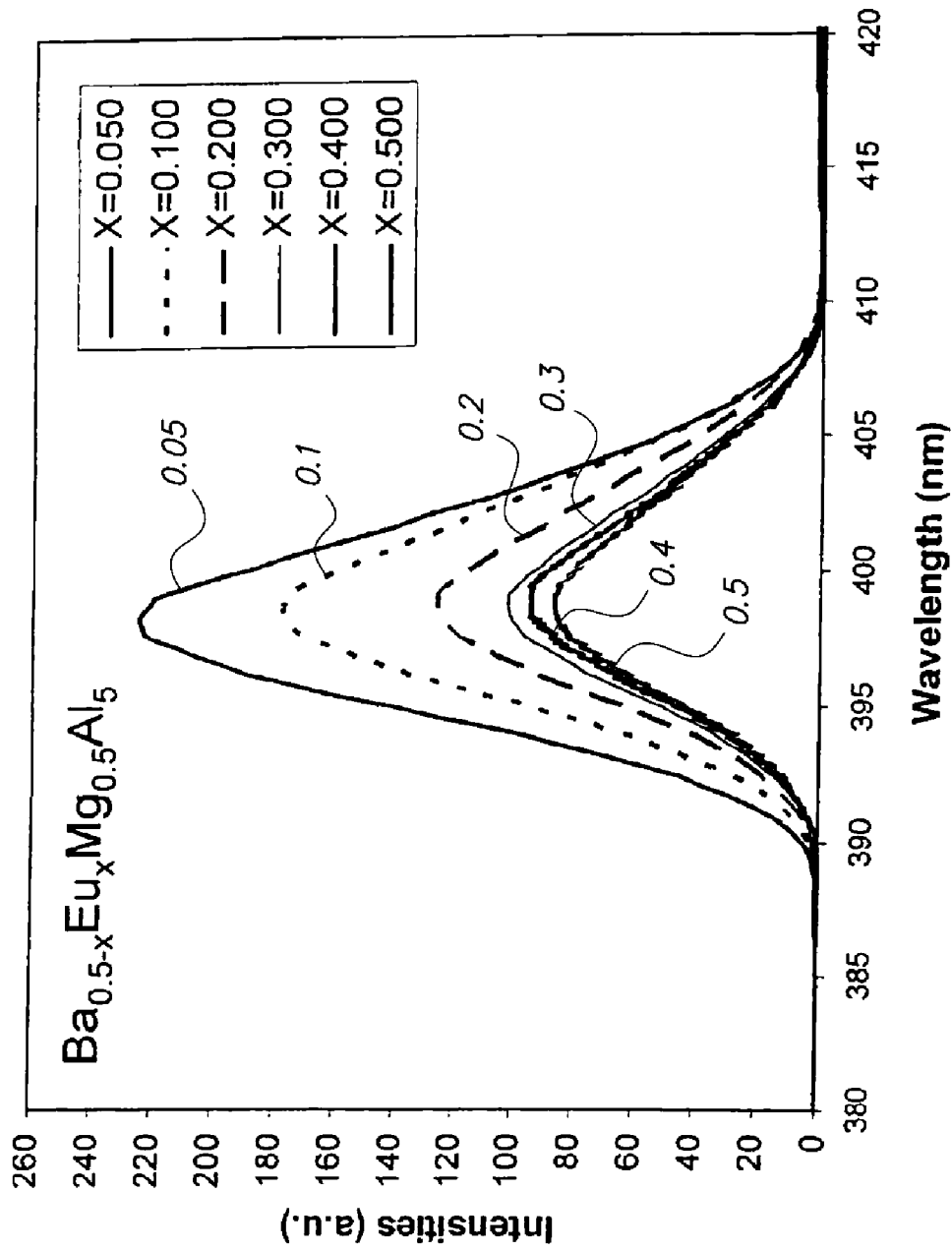

Emission and reflection spectra for an exemplary BAM of the present embodiments, showing the effects of a variable Ba and Eu content, are shown in FIGS. 7A and 7B. The compositions tested in this series of experiments may be represented by the stoichiometric formula $Ba_{0.5-x}Eu_xMg_{0.5}Al_5O_{8.5}$. Again, this formula has been written in a form such that the amount of all of the divalent elements sum to a value of one (by atomic number). To illustrate the concept of relative Ba and Eu content, the amount of aluminum has been held fixed in each of the compositions of this series. Note that if the formula had been written in the alternative form discussed above, the aluminate host hexagonal crystal would have taken the form $Al_{10}O_{17}$.

Referring to FIG. 7A, one skilled in the art will see that the wavelength at which the emission peak maximum appeared moved from about 450 nm to about 470 nm as the Eu content was increased from x=0.05 to x=0.5. Within this range of Eu content, the height of the emission peak first increased, reaching the strongest emissions for compositions with x=0.2 to x=0.3. The emission intensity then decreased as more Eu was added to reach the x=0.5 composition.

The reflection spectra for the series of compounds represented by $Ba_{0.5-x}Eu_xMg_{0.5}Al_5O_{8.5}$ is shown in FIG. 7B. Here, the intensity of the reflected peak decreased in order as the Eu content was increased from x=0.05 to x=0.5.

Figure 8:
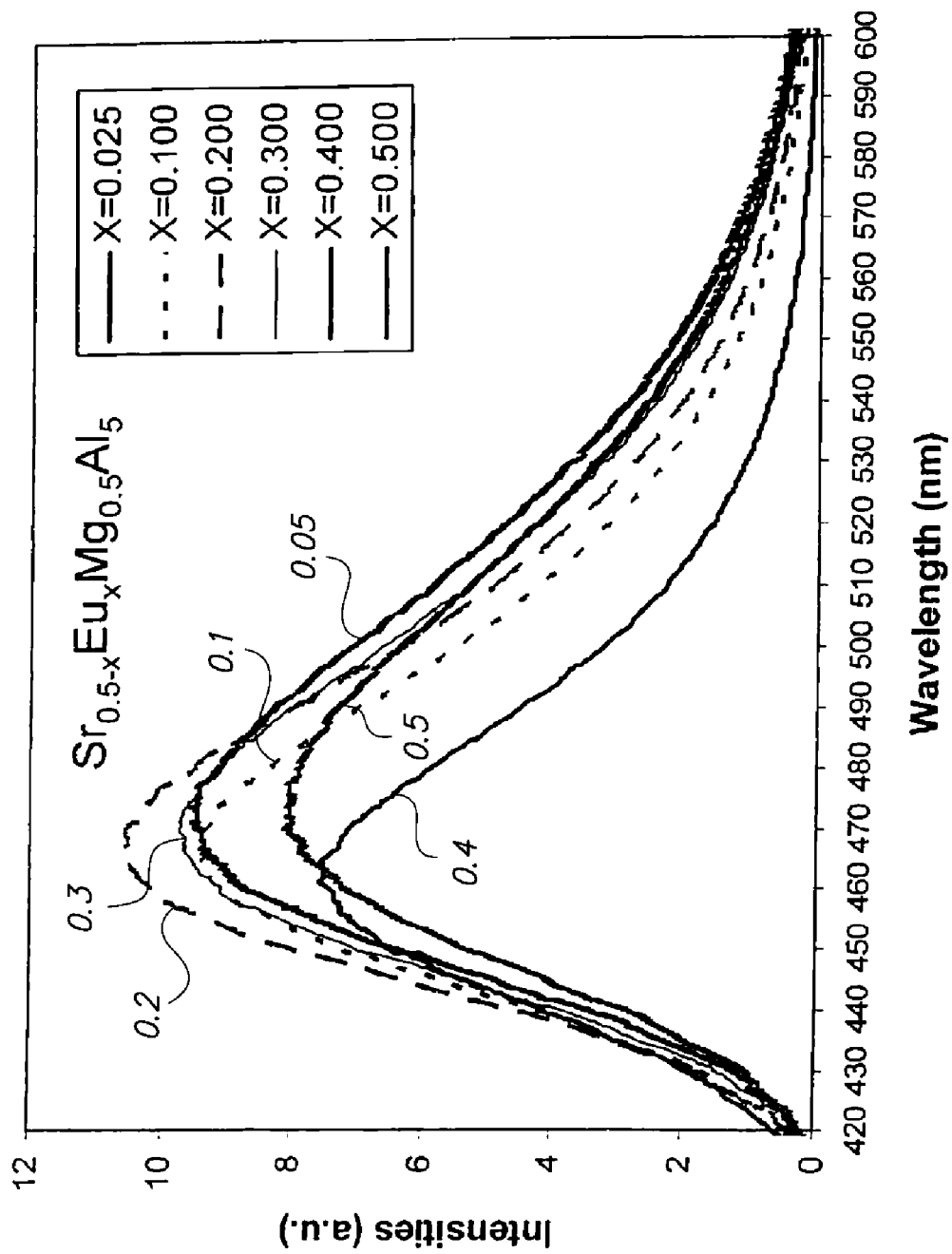
FIG. 8 shows emission spectra from a series of the present strontium aluminum magnesium (SAM) phosphors wherein the relative content of the strontium and the Eu activator has been varied: these phosphors may be represented by the formula $Sr_{0.5-x}Eu_xMg_{0.5}Al_5O_{8.5}$.

The SAM phosphors in FIG. 8 having the compositions $Sr_{0.5-x}Eu_xMg_{0.5}Al_5O_{8.5}$ showed a similar trend to the BAM phosphors of FIG. 7A. The wavelength at which the emission peak maximum appeared moved from about 465 nm to about 478 nm as the Eu content was increased from x=0.05 to x=0.5. Within this range of Eu content, the height of the emission peak first increased (as it did with the BAM series), also reaching the strongest emission for compositions with x=0.2 to x=0.3, with the emission intensity then decreasing as more Eu was added to reach the x=0.5 composition.

Though not shown graphically, the SAM reflection series for varying europium content showed the same trend as that for the BAM series: the height of the reflection peaks decreased continuously as the amount of Eu was increased.

To summarize, both the BAM and SAM composition series reached maximum emission when the Eu content was between about x=0.2 and 0.3, and the range of the wavelength shift of the emitted light was about 28 nm for the BAM series and 14 nm for the SAM series as x was varied from 0.05 to 0.5. Thus, FIGS. 7A, 7B, and 8 suggest that BAM and SAM phosphors compositions may be optimized for low reflection, high brightness, and the desired color of the output. This ability to fine-tune compositions with regard to brightness and color is particularly useful for white LED applications.

The Role of the Halogen Dopant in the Present Phosphors

Embodiments of the present invention include aluminate-based blue phosphors further including a halogen dopant; these phosphors may be represented by the formula $(M_{1-x}Eu_x)_{2-z}Mg_zAl_yO_{[2+(3/2)y]}$:D; where D is a halogen from group VIIB of the periodic table. In some embodiments of the present invention, D may be F (fluorine), Cl (chlorine), Br (bromine), or I (iodine). The halogen atoms may be either substitutionally present on host lattice sites, or as interstitial components referred to in this disclosure as an "addition." Whether the halogen is present as an "addition" or as a "substitution," the presence of the halogen is found to play an important role in the behavior of the phosphor.

Embodiments of the present invention may also include mixtures of BAM and SAM components with the halogen dopant.

Figure 9:
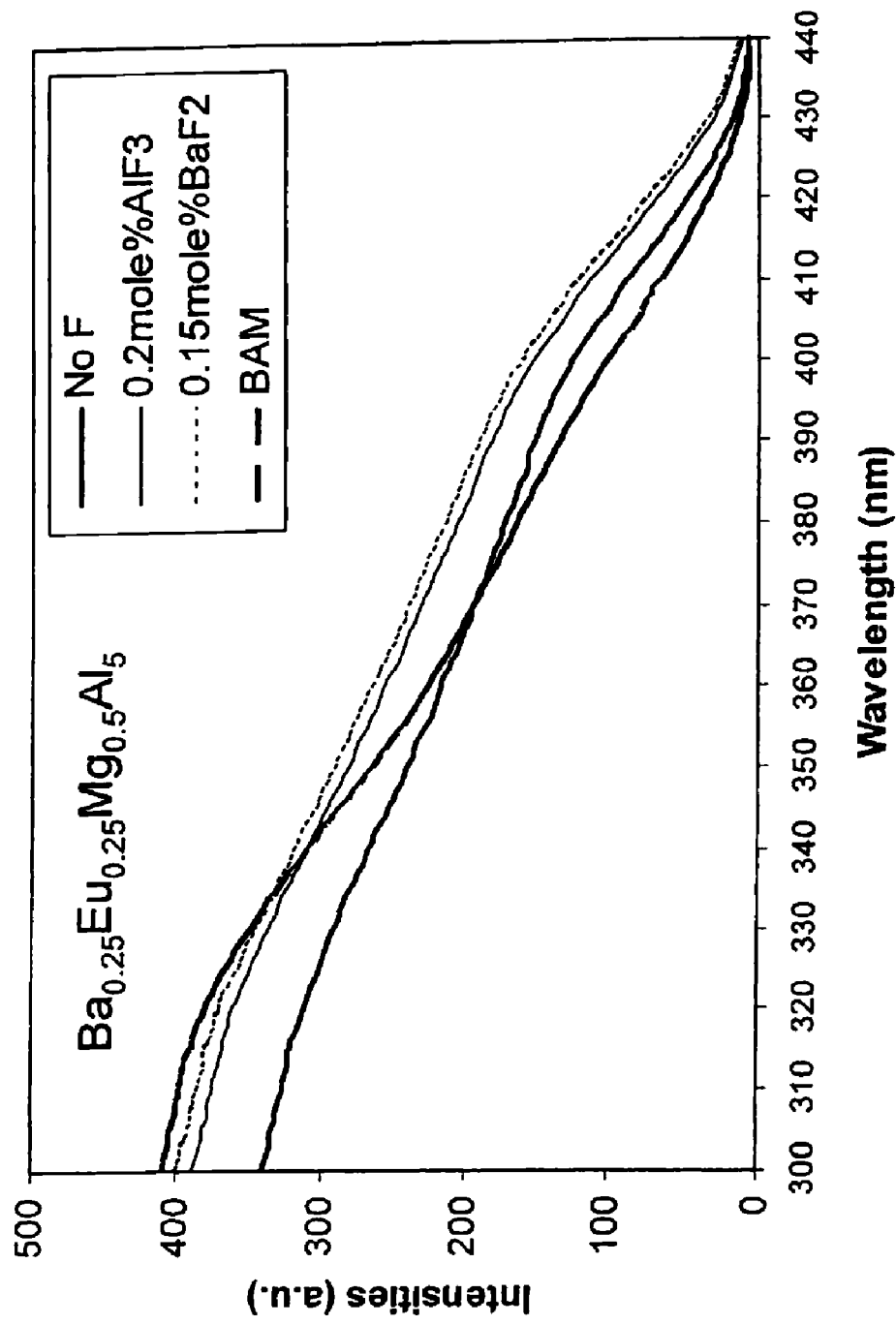
FIG. 9 shows the effect on an excitation spectrum of adding fluorine to a series of BAM phosphors having the formula $Ba_{0.25}Mg_{0.5}Eu_{0.25}Al_5O_{8.5}$.

The effect of including a halogen dopant into one of the BAM phosphors according to the present embodiments is illustrated in both Table 1 and FIG. 9.

TABLE 1

Emission Intensities of $Ba_{0.25}Eu_{0.25}Mg_{0.5}Al_5O_{8.5}$ with halogen dopant

| Fluoride precursor | Amount included (moles) | Type of inclusion | Emission intensity (A.U.) | Reflection intensity (A.U.) |
|---|---|---|---|---|
| none | none | none | 810 | 3450 |
| $AlF_3$ | 0.1 | Addition | 1000 | 3300 |
| $AlF_3$ | 0.2 | Addition | 1020 | 3000 |
| $AlF_3$ | 0.3 | Addition | 900 | 3600 |
| $AlF_3$ | 0.4 | Addition | 920 | 3750 |
| $MgF_2$ | 0.05 | Substitution | 880 | 3200 |
| $MgF_2$ | 0.10 | Substitution | 890 | 3550 |
| $MgF_2$ | 0.15 | Substitution | 880 | 3600 |
| $BaF_2$ | 0.10 | Substitution | 950 | 3600 |
| $BaF_2$ | 0.15 | Substitution | 1040 | 3500 |

Though not wishing to be bound by any particular theory, the data in Table 1 shows that halogens may be present either as an interstituent of the host aluminate crystal (i.e., as an "addition" in Table 1), or substitutionally, wherein the halogen atom sits on a lattice site of the crystal. Either way, the presence of the halogen effects both the emission and reflection characteristics of the phosphor.

The effect of halogen inclusion may be shown graphically as well. FIG. 9 is an excitation spectrum of a BAM having the stoichiometric formula $Ba_{0.25}Eu_{0.25}Mg_{0.5}Al_5O_{8.5}$, where the intensity of the light emitted at 460 nm from the phosphor is plotted as a function of the wavelength of the excitation radiation. FIG. 9 shows that inclusion of the halogen fluorine does indeed have an influence on the BAM phosphors' emitted intensity.

Temperature Dependence of Emission Intensity

It will be apparent to those skilled in the art that the emission intensity of a phosphor should be, desirably, substantially independent of temperature. Certain market applications of a phosphor such as high power LEDs may require it to be used at elevated temperatures as high as 200° C., and optimally the phosphor should demonstrate a relatively constant emission intensity over a wide range of temperatures, including the elevated temperatures of challenging market applications.

Figure 10:
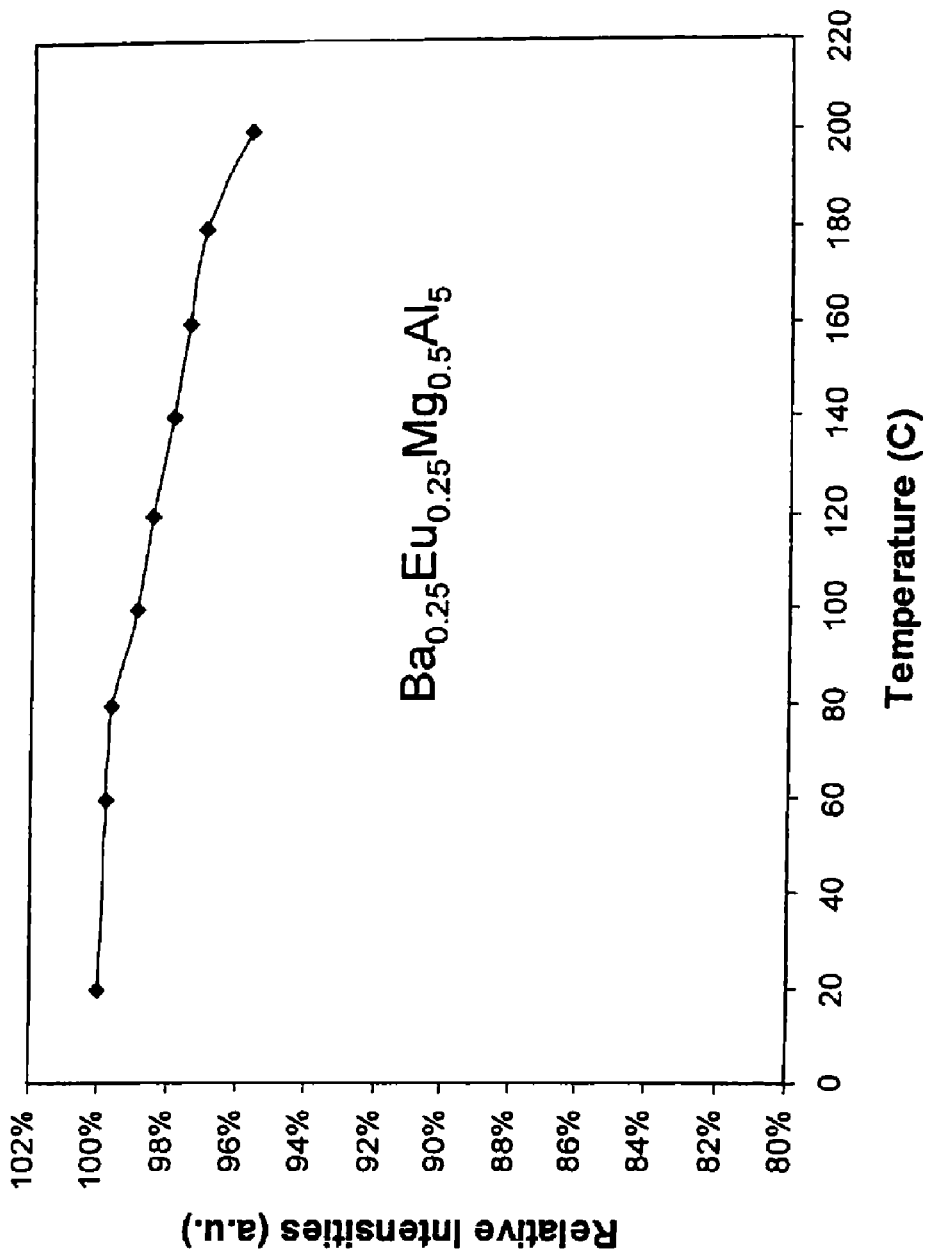
FIG. 10 is a graph showing the temperature dependence of the emission intensity for a phosphor with high Eu activator content having the composition $Ba_{0.25}Eu_{0.25}Mg_{0.5}Al_5O_{8.5}$, illustrating that this phosphor emits with a relatively constant intensity over a wide range of temperatures.

The present aluminate-based blue phosphors are able to demonstrate such temperature stability, as depicted in FIG. 10. Using a relative emission intensity of about 100 percent for a phosphor being tested at about 20 degrees C., it was found by the present inventors that the intensity (in arbitrary units) decreased by no more than about four percent as the test temperature was increased to 200 degrees C.

The Near-UV Radiation Source

In general, the aluminate-based blue phosphors of the present embodiments are not particularly responsive to excitation radiation having wavelengths greater than about 420 nm. According to the present embodiments, the near-UV LED emits light that is substantially in the non-visible portion of the electromagnetic spectrum, for example, radiation having a wavelength up to about 420 nm. Such an LED may comprise any semiconductor diode based on a layering of suitable II-V, II-VI, or IV-IV semiconductors whose junctions have an emission wavelength of 420 nm and below. For example, the LED may contain at least one semiconductor layer based on GaN, ZnSe, or SiC semiconductors. The LED may also contain one or more quantum wells in the active region, if desired. Preferably, the LED active region may comprise a p-n junction comprising GaN, AlGaN and/or InGaN semiconductor layers. The p-n junction may be separated by a thin undoped InGaN layer or by one or more InGaN quantum wells. The LED may have an emission wavelength between 300 and 420 nm, preferably between 340 and 405 nm. For example, the LED may have the following wavelengths: 350, 355, 360, 365, 370, 375, 380, 390, 405 or 410.

The near-UV excitation devices of the present embodiments are herein described generically as "LEDS," but it will be understood by those skilled in the art that the source of excitation radiation may be at least one of (wherein it is contemplated to have several operating simultaneously) an LED, a laser diode, a surface emitting laser diode, a resonant cavity light emitting diode, an inorganic electroluminescence device and an organic electroluminescence device.

Yellow Phosphors in Combination with the Present Blue BAM and SAM Phosphors

The yellow phosphors that may be used in such a white light LED illumination system may be conventional yttrium aluminum garnet (YAG) phosphors previously described in the art, or they may comprise phosphors described in U.S. patent application Ser. No. 10/948,764, filed Sep. 22, 2004, now U.S. Pat. No. 7,311,858, issued Dec. 25, 2007, incorporated herein by reference. This yellow phosphor is configured to absorb at least a portion of the radiation from the radiation source, and emit light with peak intensity in a wavelength ranging from about 530 to 590 nm.

Red and Green Phosphors in Combination with the Present Blue Phosphors

Many red phosphors known in the art may be used in conjunction with the present aluminate-based blue phosphors in white light illumination systems. One red phosphor that may be used is selected from the group consisting of CaS:$Eu^{2+}$, SrS:$Eu^{2+}$, MgO*MgF*GeO:$Mn^{4+}$, and $M_xSi_yN_z$:$Eu^{+2}$, where M is selected from the group consisting of Ca, Sr, Ba, and Zn; Z=2/3x+4/3y, and wherein the red phosphor is configured to absorb at least a portion of the radiation from the radiation source and emit light with peak intensity in a wavelength ranging from about 590 to 690 nm.

Green phosphors that may be used in conjunction with the present aluminate-based blue phosphors comprise aluminate oxides or silicates of alkaline earth metals, with a rare earth activator such as europium in a +2 valence state (e.g., $Eu^{2+}$). An early disclosure by H. Lange in U.S. Pat. No. 3,294,699, for example, described a strontium aluminate composition activated with an europium (II) oxide, wherein the amount of the europium oxide added to the strontium aluminate was between about 2 and 8 mol percent. A specific luminescent material was 0.9 SrO.$Al_2O_3$.0.03 EuO, which was shown to emit light in a broad band spectrum having a peak response in the green region of about 520 millimicrons when excited by the mecury line at 365 millimicrons (nanometers).

Another green phosphor that may be used in conjunction with the present aluminate-based blue phosphors has been described in U.S. Pat. No. 6,555,958 to A. M. Srivastava et al. Disclosed in this patent were both silicate and aluminate-based blue-green phosphors, the aluminate-based compositions being generally represented by the formula AAlO:Eu:$^{2+}$, where A comprised at least one of Ba, Sr, or Ca. The preferable composition disclosed in this patent was AAl$_2$O$_4$:Eu$^{2+}$, where A comprised at least 50% Ba, preferably at least 80% Ba and 20% or less Sr. When A comprised Ba, the phosphor peak emission wavelength was about 505 nm and the phosphor quantum efficiency was "high." When A comprised Sr, the phosphor peak emission wavelength was about 520 and the phosphor quantum efficiency was "fairly high." Thus, it was disclosed by this patent that A most preferably comprised Ba to obtain a peak wavelength closest to 505 nm and to obtain the highest relative quantum efficiency. Further revealed was that in the alkaline earth aluminate phosphor, the europium activator substitutes on the alkaline earth lattice site, such that the phosphor may be written as $(A_{1-x}Eu_x)Al_2O_4$, where $0<x\leq0.2$. The most preferred phosphor composition was $(Ba_{1-x}Eu_x)Al_2O_4$, where $0<x\leq0.2$. The compositions disclosed in this patent did not contain magnesium or manganese.

U.S. Pat. No. 5,879,586 to K. Kitamura et al. disclosed a green phosphor where the rare earth component of this phosphor was cerium and terbium, according to the formula $(Ce_{1-w}Tb_w)Mg_xAl_yO_z$, where $0.03\leq w\leq0.6$; $0.8\leq x\leq1.2$; $9\leq y\leq13$; and $15\leq z\leq23$. This terbium containing compound was reported to emit "high-luminance green light," but relative intensities and peak emission wavelengths were not given, and this green light emitting compound did not contain europium as an activating rare earth element. A "high-luminescence blue-green" emitting phosphor based on strontium as the alkaline earth and europium as the activator was expressed by the formula $(Sr_{4(1-w)}Eu_{4w})Al_xO_y$, where $0.01\leq w\leq0.6$; $11\leq x\leq17$; and $20\leq y\leq30$ but again, relative intensities and peak emission wavelengths were not given.

Green phosphors based on thiogallates have been disclosed. In U.S. Pat. No. 6,686,691 to G. O. Mueller et al., a device comprising a green phosphor and a blue LED (the green phosphor absorbing blue light from the blue LED) was disclosed. In one embodiment, the green phosphor was based on a host sulfide material; in other words, a lattice which included sulfide ions. A preferred host sulfide material was a thiogallate such as SrGa$_2$S$_4$, and when activated by the rare earth europium, the green phosphor SrGa$_2$S$_4$:Eu demonstrated a spectrum having a luminous equivalent value of about 575 lm/W at a maximum wavelength of about 535 nm. The dopant (rare earth Eu) concentration in the SrGa$_2$S$_4$ host was preferably from about 2 to 4 mol %. The blue LED providing the excitation radiation to the green phosphor was an (In,Ga)N diode emitting radiation at a wavelength from about 450 to 480 nm.

A similar strontium thiogallate based phosphor used as a backlight for an LCD has been described by C. H. Lowery in published U.S. application 2004/0061810. In this disclosure, the wavelength-converting material selected to absorb light emitted by the active region of the LED die could be either the strontium thiogallate phosphor described above, or a nitridosilicate phosphor. The strontium thiogallate phosphor had a dominant emission wavelength of about 542 nm. The wavelength-converting material absorbed blue light from the LED die either in a region from about 420 to 460 nm, or, in other embodiments, in a region ranging from about 380 to 420 nm. Again, these devices comprising green-emitting phosphors eliminated problems encountered with green LEDs, such as high temperature stability, and temperature-induced variations in color.

U.S. Pat. No. 6,805,814 to T. Ezuhara et al. describe a green light emitting phosphor or use in plasma displays, the phosphor represented by the formula $M^1_{1-a}M^2_{11-b}Mn_{a+b}O_{18-(a+b)/2}$, where $M^1$ is at least one of La, Y, and Gd, and $M^2$ is at least one of Al and Ga. In cases where the phosphor contains Al (e.g., wherein the phosphor is an aluminate), the alumina has a purity of not less than 99.9%, and a crystal structure of either a alumina or an intermediate alumina such as aluminum hydroxide. The peak emission wavelengths of these green light emitting phosphors was not given. The excitation wavelengths were in the vacuum ultraviolet.

Green phosphors that may be used in conjunction with the present aluminate-based blue phosphors in a white light illumination system have been described in U.S. Patent Publication No. US-2006-0158090-A1; incorporated herein by reference.

Putting it All Together: A White LED Based on the Present Blue Phosphors

Figure 11:
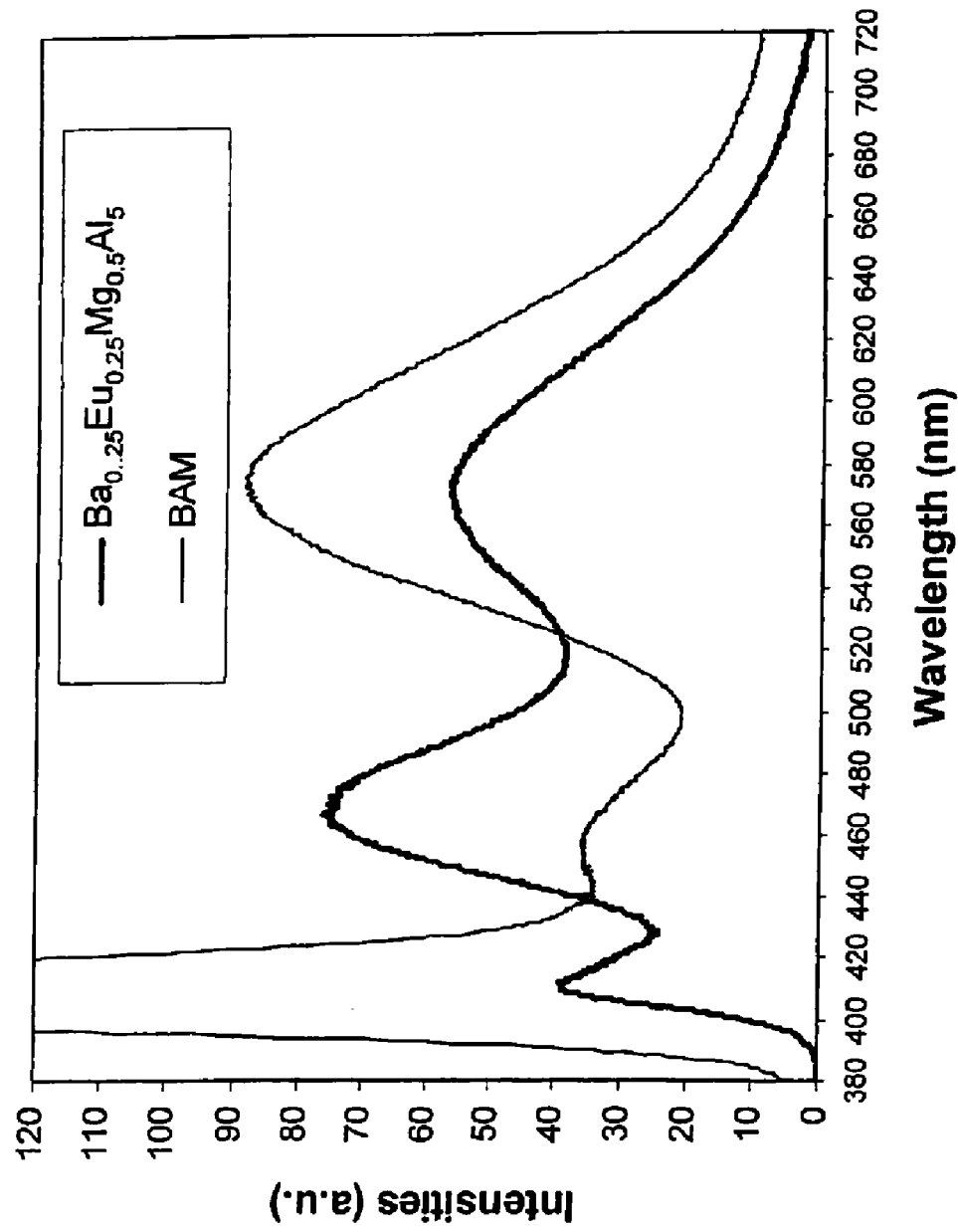
FIG. 11 is an emission spectra of a white LED containing the present BAM phosphors, wherein that data is compared to the emission of a white LED having a conventional BAM phosphor.

Advantages of the present BAM and SAM blue phosphors include their ability to contribute to the desired coloring of a white LED illumination system. The optical properties of a white LED system using the present blue aluminate-based phosphors are shown in FIG. 11.

Phosphor Fabrication Processes

Methods of fabricating the novel aluminate-based phosphors of the present embodiments are not limited to any one fabrication method, but may, for example, be fabricated in a three step process that includes: 1) blending starting materials, 2) firing the starting material mix, and 3) various processes to be performed on the fired material, including pulverizing and drying. The starting materials may comprise various kinds of powders, such as alkaline earth metal compounds, aluminum compounds, and europium compounds. Examples of the alkaline earth metal compounds include alkaline earth metal carbonates, nitrates, hydroxides, oxides, oxalates, and halides. Examples of aluminum-containing compounds include its nitrates, fluorides and oxides. Examples of europium compounds include europium oxide, europium fluoride, and europium chloride.

The starting materials are blended in a manner such that the desired final composition is achieved. In one embodiment, for example, the alkaline-earth, aluminum-containing compounds (and/or germanium), and europium compounds are bended in the appropriate ratios, and then fired to achieve the desired composition. The blended starting materials are fired in a second step, and to enhance the reactivity of the blended materials (at any or various stages of the firing), a flux may be used. The flux may comprise various kinds of halides and boron compounds, examples of which include strontium fluoride, barium fluoride, calcium fluoride, europium fluoride, ammonium fluoride, lithium fluoride, sodium fluoride, potassium fluoride, strontium chloride, barium chloride, calcium chloride, europium chloride, ammonium chloride, lithium chloride, sodium chloride, potassium chloride, and combinations thereof. Examples of boron-containing flux compounds include boric acid, boric oxide, strontium borate, barium borate, and calcium borate.

In some embodiments, the flux compound is used in amounts where the number of mole percent ranges from between about 0.01 to 0.2 mole percent, where values may typically range from about 0.01 to 0.1 mole percent, both inclusive.

Various techniques for mixing the starting materials (with or without the flux) include using a mortar, mixing with a ball mill, mixing using a V-shaped mixer, mixing using a cross rotary mixer, mixing using a jet mill and mixing using an agitator. The starting materials may be either dry mixed or wet mixed, where dry mixing refers to mixing without using a solvent. Solvents that may be used in a wet mixing process include water or an organic solvent, where the organic solvent may be either methanol or ethanol.

The mix of starting materials may be fired by numerous techniques known in the art. A heater such as an electric furnace or gas furnace may be used for the firing. The heater is not limited to any particular type, as long as the starting material mix is fired at the desired temperature for the desired length of time. In some embodiments, firing temperatures may range from about 800 to 1600° C. The firing time may range from about 10 minutes to 1000 hours. The firing atmosphere may be selected from among air, a low-pressure atmosphere, a vacuum, an inert-gas atmosphere, a nitrogen atmosphere, an oxygen atmosphere, an oxidizing atmosphere, and/or the compositions may be fired in a reducing atmosphere at 100 to 1600° C. for about 2 to 10 hours.

One method of preparing an aluminate-based blue phosphor is directed to preparing a blue phosphor having the formula $M_{1-x}Eu_xAl_yO_{1+3y/2}$, wherein M is at least one of a divalent metal selected from the group consisting of Ba, Sr, Ca, Mg, Mn, Zu, Cu, Cd, Sm, and Tm; where $0.1<x<0.9$; and $2<y<12$. The method of preparing the phosphor may be either one of a sol-gel method or a solid reaction method. In this method, a metal nitrate may be used to provide the divalent metal component of the green phosphor, as well as the the aluminum component of the aluminate-based green phosphor. The metal nitrate that supplies the divalent metal component may be $Ba(NO_3)_2$, $Mg(NO_3)_2$, $Sr(NO_3)_2$, or $Ca(NO_3)_2$, and the metal nitrate that provides the aluminum may be $Al(NO_3)_3$.

This method further comprises the step of using a metal oxide to provide the oxygen component of the aluminate-based green phosphor.

An example of the method comprises the following steps:
a) providing raw materials selected from the group consisting of $Ba(NO_3)_2$, $Mg(NO_3)_2$, $Ca(NO_3)_2$, $Sr(NO_3)_2$, $Al(NO_3)_3$, and $Eu_2O_3$;
b) dissolving the $Eu_2O_3$ in a nitric acid solution, and then mixing a desired amount of the metal nitrates to form an aqueous-based nitrate solution;
c) heating the solution of step b) to form a gel;
d) heating the gel of step c) to about 500-1000° C. to decompose the nitrate mixture to an oxide mixture; and
e) sintering the powder of step d) in a reducing atmosphere at a temperature of about 1000-1500° C. for about 1 to 10 hours.

Next, a generalized description of the CIE diagram will be given, along with a description of where the present blue phosphors appear on the CIE diagram.

Chromaticity Coordinates on a CIE Diagram, and the CRI

Color quality can be measured by a number of different rating systems. Chromaticity defines color by hue and saturation. CIE is a chromaticity coordinate system developed by the Commission International de l'Eclairage (international commission of illumination). The CIE Chromaticity Coordinates are coordinates that define a color in "1931 CIE" color space. These coordinates are defined as x, y, z, and are ratios of the three standard primary colors X, Y, Z (tristimulus values) in relation to the sum of the three tristimulus values. A CIE chart contains a plot of the x, y, and z ratios of the tristimulus values versus their sum. In the situation where the reduced coordinates x, y, and z add to 1, typically, a two-dimensional CIE (x, y) plot is used.

For the display applications relevant to the present blue phosphors, color space is independent of the red, green, and blue light components in terms of their location in color space. The blue phosphors of the present embodiments are particularly useful in generating the larger color spaces advantageous for RGB backlighting displays, referred to in the art as "wide color gamut displays." Color coordinates in this range of values with higher luminescence efficiency clearly have advantages for the lighting and display industry.

Figure 12:
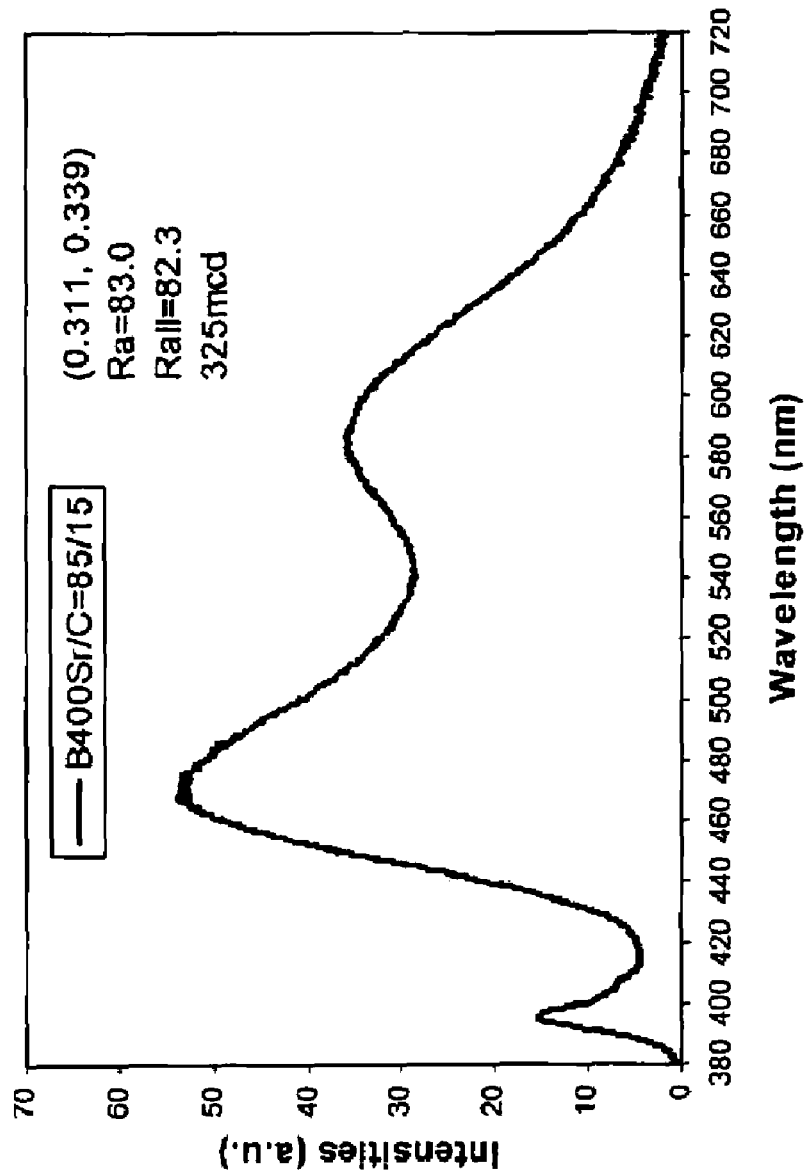
FIG. 12 is a graph of emission intensity versus wavelength for a phosphor package that includes the inventive blue phosphor having the formula $(Sr_{0.5}Eu_{0.5})MgAl_{10}O_{17}$, and an inventive orange phosphor by the same inventors (to be described in a separate disclosure), the orange phosphor having the formula $Sr_3SiO_5:EuF$.

Multiple color phosphors used with non-visible UV LED chips is an optimal approach for all different white LED applications. The better color rendering CRI with more uniform and controllable white light can be achieved by this approach than the conventional approach of yellow phosphor using blue LED chips. The present inventive blue phosphors with higher efficiency at near UV range will play a crucial role for white LEDs using UV chip approach. FIG. 11 shows a demonstration of a white LED spectrum from an assembly of a 405 nm UV chip and the combination of the present BAM phosphor and yellow or orange phosphors. FIG. 12 shows a demonstration of a white LED spectrum from an assembly of a 405 nm UV chip and the combination of the present SAM phosphor and yellow or orange phosphors.

FIG. 12 is a graph of emission intensity versus wavelength for a phosphor package that includes the inventive blue phosphor having the formula $(Sr_{0.5}Eu_{0.5})MgAl_{10}O_{17}$, and an inventive orange phosphor by the same inventors (to be described in a separate disclosure), the orange phosphor having the formula $Sr_3SiO_5$:EuF. The excitation wavelength was 395 nm. This phosphor package shows a maximum intensity in the blue region of the electromagnetic spectrum at about 460 to 480 nm, with a secondary maximum in the orange region at about 580 to 600 nm.

Many modifications of the exemplary embodiments of the invention disclosed above will readily occur to those skilled in the art. Accordingly, the invention is to be construed as including all structure and methods that fall within the scope of the appended claims.

What is claimed is:

1. An aluminate-based blue phosphor having the formula $(M_{1-x}Eu_x)_{2-z}Mg_zAl_yO_{[2+(3/2)y]}$, wherein:
M is at least one of a divalent metal selected from the group consisting of Ba and Sr; where
$0.05<x<0.5$;
$3\leq y<8$; and
$0.8\leq z\leq 1.2$;
wherein the phosphor is configured to absorb radiation in a wavelength ranging from about 280 nm to 420 nm, and to emit visible light having a wavelength ranging from about 420 nm to 560 nm.

2. The blue phosphor of claim 1, wherein the host aluminate crystal structure is substantially a hexagonal crystal structure.

3. An aluminate-based blue phosphor having the formula $(M_{1-x}Eu_x)_{2-z}Mg_zAl_yO_{[2+(3/2)y]}$, wherein:
M is at least one of a divalent metal selected from the group consisting of Ba and Sr; where
$0.2<x<0.5$;
$3\leq y<8$; and
$0.8\leq z\leq 1.2$;
wherein the phosphor is configured to absorb radiation in a wavelength ranging from about 280 nm to 420 nm, and to emit visible light having a wavelength ranging from about 420 nm to 560 nm.

4. An aluminate-based blue phosphor having the formula $(M_{1-x}Eu_x)_{2-z}Mg_zAl_yO_{[2+(3/2)y]}$:D, wherein:
M is at least one of a divalent metal selected from the group consisting of Ba and Sr; where
$0.05<x<0.5$;
$3\leq y\leq 12$; and
$0.8\leq z\leq 1.2$;

wherein D is a halogen selected from the group consisting of fluorine, chlorine, bromine, and iodine subject to the proviso that compositions of the formula $M_{1-x}Eu_xMgAl_{10}O_{17}$ are specifically excluded.

5. An aluminate-based blue phosphor having the formula $(M_{1-x}Eu_x)_{2-z}Mg_zAl_yO_{[2+(3/2)y]}$:D, wherein:

M is at least one of a divalent metal selected from the group consisting of Ba and Sr; where $0.2<x<0.5$;

$3 \leq y \leq 12$; and $0.8 \leq z \leq 1.2$;

wherein D is a halogen selected from the group consisting of fluorine, chlorine, bromine, and iodine subject to the proviso that compositions of the formula $M_{1-x}Eu_xMgAl_{10}O_{17}$ are specifically excluded.

6. The blue phosphor of claim 5, wherein the phosphor is configured to absorb radiation in a wavelength ranging from about 280 nm to 420 nm, and to emit visible light having a wavelength ranging from about 420 nm to 560 nm.

7. An aluminate-based blue phosphor having the formula $(M_{1-x}Eu_x)_{2-z}Mg_zAl_yO_{[2+(3/2)y]}$, wherein:

M is at least one of a divalent metal selected from the group consisting of Ba and Sr; where $0.05<x<0.5$;

$3 \leq y \leq 6$; and $0.8 \leq z \leq 1.2$;

wherein the phosphor is configured to absorb radiation in a wavelength ranging from about 280 nm to 420 nm, and to emit visible light having a wavelength ranging from about 420 nm to 560 nm.

8. The blue phosphor of claim 7, wherein the host aluminate crystal structure is substantially a hexagonal crystal structure.

9. An aluminate-based blue phosphor having the formula $(M_{1-x}Eu_x)_{2-z}Mg_zAl_yO_{[2+(3/2)y]}$, wherein:

M is at least one of a divalent metal selected from the group consisting of Ba and Sr; where $0.2<x<0.5$;

$3 \leq y \leq 6$; and $0.8 \leq z \leq 1.2$;

wherein the phosphor is configured to absorb radiation in a wavelength ranging from about 280 nm to 420 nm, and to emit visible light having a wavelength ranging from about 420 nm to 560 nm.

* * * * *